(12) United States Patent
Lin et al.

(10) Patent No.: US 10,535,525 B2
(45) Date of Patent: Jan. 14, 2020

(54) METHOD FOR FORMING SEMICONDUCTOR DEVICE STRUCTURE

(71) Applicant: Taiwan Semiconductor Manufacturing Co., Ltd., Hsinchu (TW)

(72) Inventors: Chun-An Lin, Tainan (TW); Chun-Hsiung Lin, Zhubei (TW); Kai-Hsuan Lee, Hsinchu (TW); Sai-Hooi Yeong, Zhubei (TW); Cheng-Yu Yang, Xihu Township, Changhua County (TW); Yen-Ting Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/692,221

(22) Filed: Aug. 31, 2017

(65) Prior Publication Data

US 2019/0067012 A1    Feb. 28, 2019

(51) Int. Cl.
*H01L 21/8234* (2006.01)
*H01L 21/285* (2006.01)
*H01L 21/768* (2006.01)
*H01L 29/66* (2006.01)
*H01L 29/78* (2006.01)
*H01L 29/417* (2006.01)
*H01L 29/165* (2006.01)

(52) U.S. Cl.
CPC .. *H01L 21/28506* (2013.01); *H01L 21/28518* (2013.01); *H01L 21/76831* (2013.01); *H01L 21/76843* (2013.01); *H01L 21/76897* (2013.01); *H01L 29/41791* (2013.01); *H01L 29/66545* (2013.01); *H01L 29/66795* (2013.01); *H01L 29/7848* (2013.01); *H01L 21/76855* (2013.01); *H01L 29/165* (2013.01); *H01L 29/785* (2013.01)

(58) Field of Classification Search
CPC ..... H01L 21/823431; H01L 21/823418; H01L 21/823425; H01L 29/785
See application file for complete search history.

(56) References Cited

U.S. PATENT DOCUMENTS 8,772,109 B2   7/2014   Colinge
8,785,285 B2   7/2014   Tsai et al.
(Continued)

*Primary Examiner* — Jae Lee
(74) *Attorney, Agent, or Firm* — McClure, Qualey & Rodack, LLP

(57) ABSTRACT

A method for forming a semiconductor device structure is provided. The method includes providing a semiconductor substrate, a gate structure, a first doped structure, a second doped structure, and a dielectric layer. The method includes forming a through hole in the dielectric layer. The method includes performing a physical vapor deposition process to deposit a first metal layer over the first doped structure exposed by the through hole. The method includes reacting the first metal layer with the first doped structure to form a metal semiconductor compound layer between the first metal layer and the first doped structure. The method includes removing the first metal layer. The method includes performing a chemical vapor deposition process to deposit a second metal layer in the through hole. The method includes forming a conductive structure in the through hole and over the second metal layer.

20 Claims, 17 Drawing Sheets

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2009/0166866 A1* | 7/2009 | Fastow | H01L 21/28518 257/751 |
| 2012/0104514 A1* | 5/2012 | Park | H01L 21/28518 257/411 |
| 2015/0093907 A1* | 4/2015 | Yieh | H01L 21/67017 438/758 |
| 2016/0118303 A1* | 4/2016 | Kuo | H01L 29/66636 257/368 |
| 2016/0181383 A1* | 6/2016 | Huang | H01L 29/41758 257/757 |
| 2017/0117380 A1* | 4/2017 | Lu | H01L 29/6656 |
| 2017/0222014 A1* | 8/2017 | Tak | H01L 23/485 |
| 2017/0283937 A1* | 10/2017 | Topalski | C23C 14/541 |
| 2017/0317213 A1* | 11/2017 | Park | H01L 21/0214 |
| 2018/0016678 A1* | 1/2018 | Fenwick | C23C 14/0641 |

\* cited by examiner

METHOD FOR FORMING SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes (e.g., a width of a through hole) continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
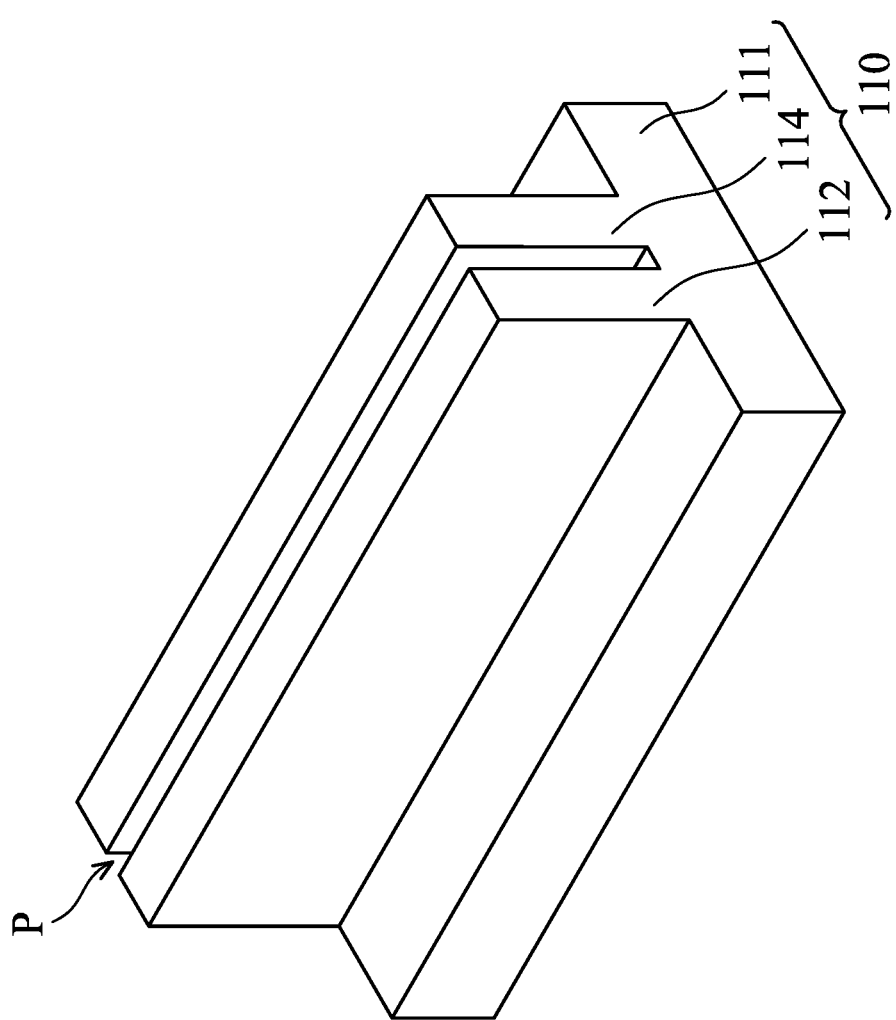
FIGS. 1A-1I are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A-1I are perspective views of various stages of a process for forming a semiconductor device structure, in accordance with some embodiments. As shown in FIG. 1A, a substrate 110 is provided, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

As shown in FIG. 1A, the substrate 110 has a base 111 and fin structures 112 and 114, in accordance with some embodiments. The fin structures 112 and 114 are over the base 111, in accordance with some embodiments. The fin structures 112 and 114 are spaced apart from each other by a trench P therebetween, in accordance with some embodiments.

Figure 1B:
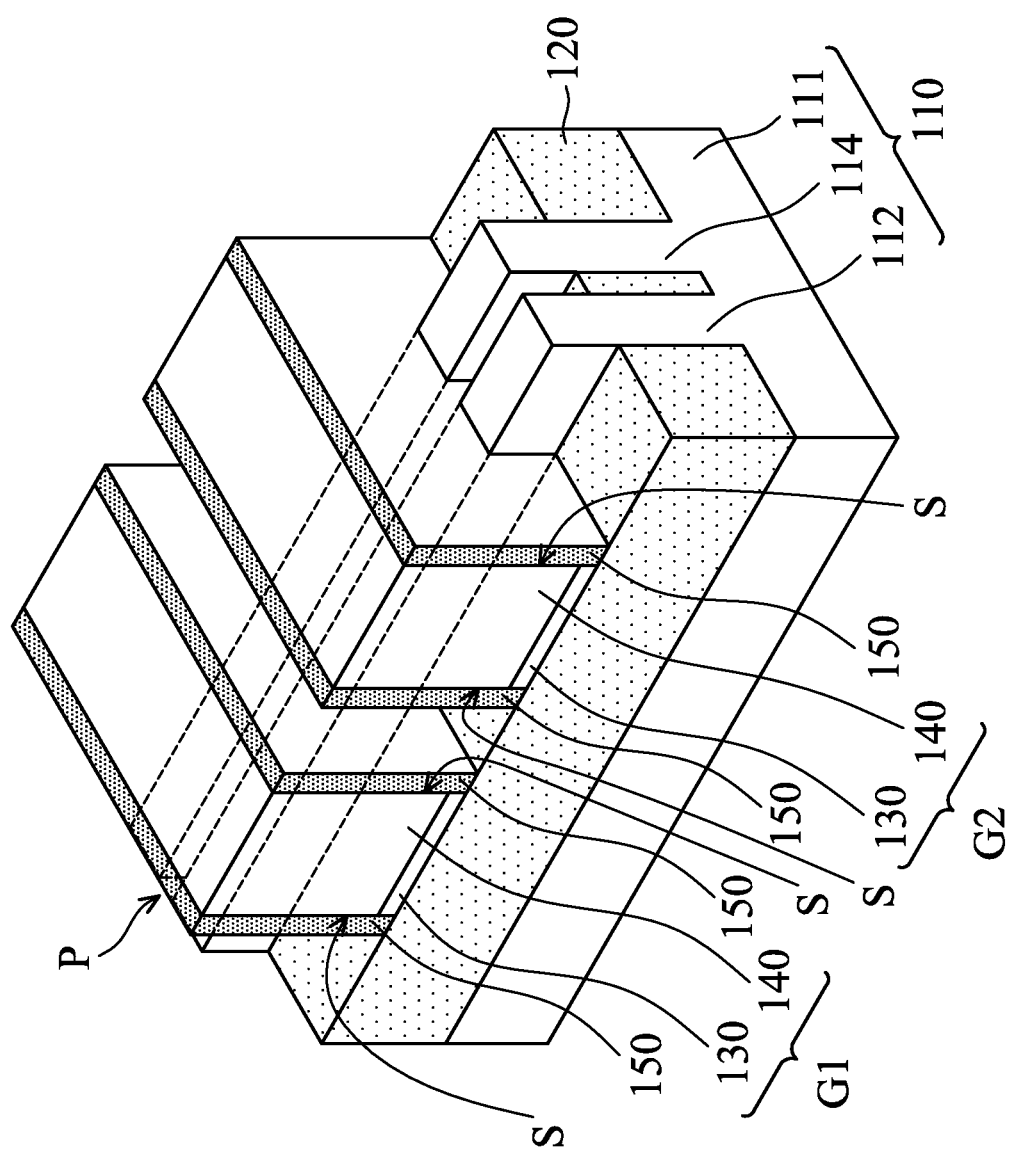

As shown in FIG. 1B, an isolation layer 120 is formed over the base 111, in accordance with some embodiments. Each of the fin structure 112 or 114 is partially in the isolation layer 120, in accordance with some embodiments. The isolation layer 120 includes oxide (such as silicon oxide), in accordance with some embodiments. The isolation layer 120 is formed by a chemical vapor deposition (CVD) process and an etching back process, in accordance with some embodiments.

As shown in FIG. 1B, gate structures G1 and G2 are formed over and across the fin structures 112 and 114, in accordance with some embodiments. Each of the gate structure G1 or G2 has a gate dielectric layer 130 and a gate electrode 140 over the gate dielectric layer 130, in accordance with some embodiments.

The gate dielectric layer 130 is positioned between the gate electrode 140 and the fin structures 112 and 114, in accordance with some embodiments. The gate dielectric layer 130 is also positioned between the gate electrode 140 and the isolation layer 120, in accordance with some embodiments. Portions of the gate structures G1 and G2 are in the trench P, in accordance with some embodiments.

The gate dielectric layer 130 is made of silicon oxide, in accordance with some embodiments. The gate dielectric layer 130 is formed using a chemical vapor deposition process (CVD process) and an etching process, in accordance with some embodiments. The gate electrode 140 is made of polysilicon, in accordance with some embodiments. The gate electrode 140 is formed using a chemical vapor deposition process and an etching process, in accordance with some embodiments.

As shown in FIG. 1B, a spacer layer 150 is formed over sidewalls S of the gate structures G1 and G2, in accordance with some embodiments. The spacer layer 150 surrounds the gate structures G1 and G2, in accordance with some embodiments. The spacer layer 150 is positioned over the fin structures 112 and 114 and the isolation layer 120, in accordance with some embodiments.

The spacer layer 150 includes insulating materials, such as silicon oxide, silicon nitride, silicon oxynitride, or silicon carbide, in accordance with some embodiments. The formation of the spacer layer 150 includes a deposition process and an anisotropic etching process, in accordance with some embodiments.

Figure 1C:
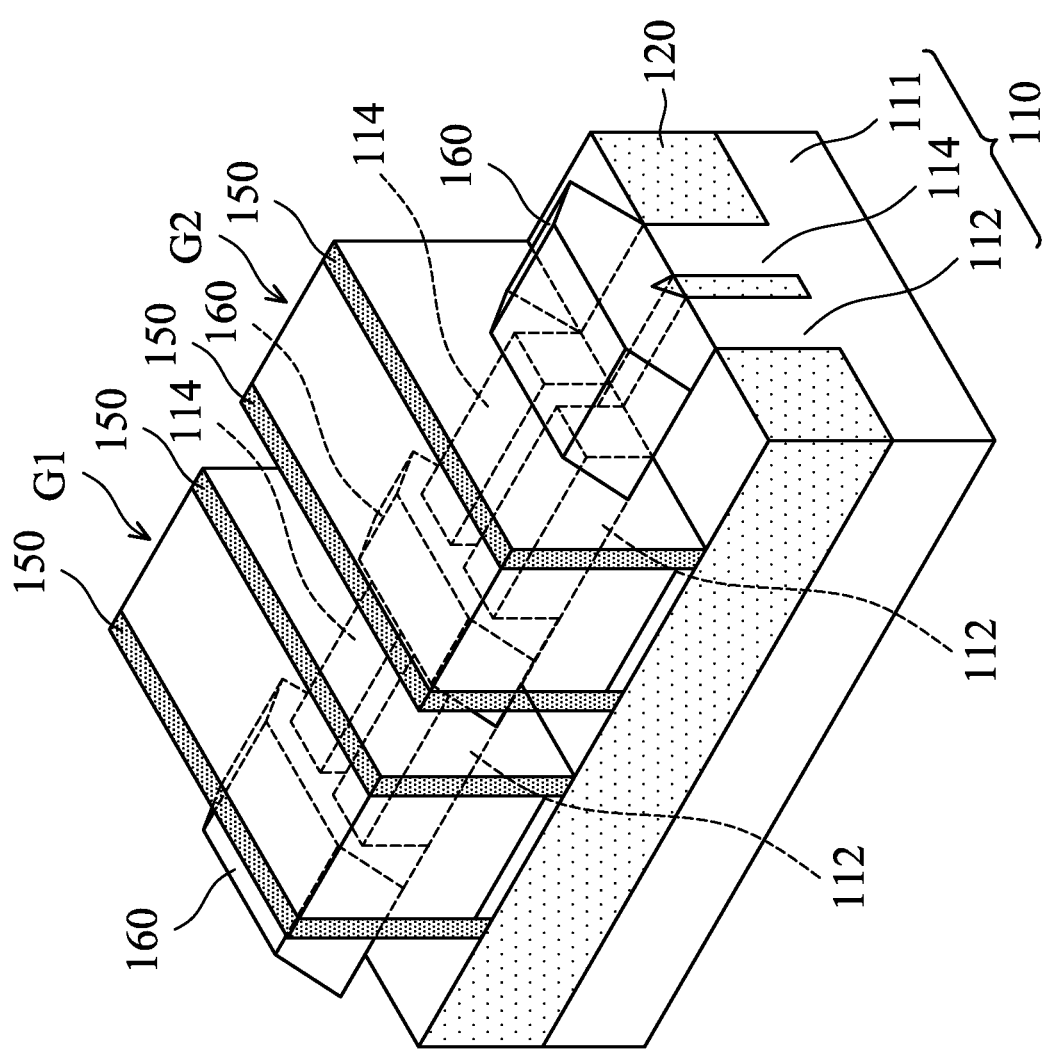

As shown in FIG. 1C, portions of the fin structures 112 and 114, which are outside of the isolation layer 120 and not covered by the gate structures G1 and G2 and the spacer layer 150, are removed, in accordance with some embodiments. The removal process includes an etching process, in accordance with some embodiments.

As shown in FIG. 1C, stressors 160 are formed on the fin structures 112 and 114, in accordance with some embodiments. The stressors 160 are in direct contact with the fin structures 112 and 114, in accordance with some embodiments. The stressors 160 are positioned on two opposite sides of each of the gate structure G1 or G2, in accordance with some embodiments. In some embodiments, the stressors 160 include one or two source structures and one or two drain structures.

The stressors 160 are made of an N-type conductivity material, in accordance with some embodiments. The N-type conductivity material includes silicon phosphorus (SiP) or another suitable N-type conductivity material. The stressors 160 are formed using an epitaxial process, in accordance with some embodiments.

The stressors 160 are doped with the Group VA element, in accordance with some embodiments. The Group VA element includes phosphor (P), antimony (Sb), or another suitable Group VA material. In some embodiments, a concentration of the Group VA element (e.g. phosphor) ranges from about 3E21 atoms/cm$^3$ to about 7E21 atoms/cm$^3$. The stressors 160 are also referred to as doped structures, in accordance with some embodiments.

In some other embodiments, the stressors 160 are made of a P-type conductivity material, in accordance with some embodiments. The P-type conductivity material includes silicon germanium (SiGe) or another suitable P-type conductivity material. The stressors 160 are formed using an epitaxial process, in accordance with some embodiments. The stressors 160 are doped with the Group IIIA element, in accordance with some embodiments. The Group IIIA element includes boron or another suitable material.

Figure 1D:
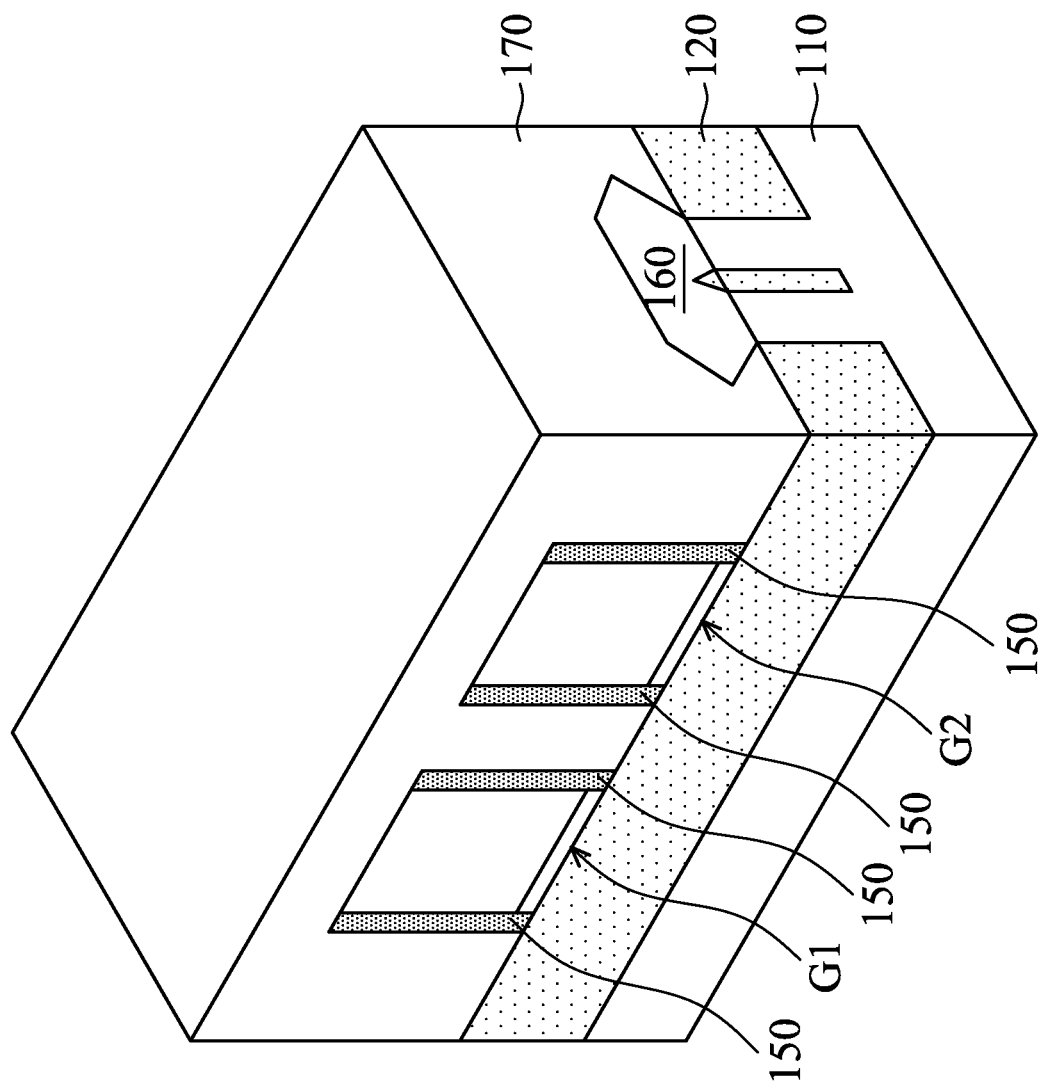

As shown in FIG. 1D, a dielectric layer 170 is formed over the gate structures G1 and G2, the spacer layer 150, the isolation layer 120, and the stressors 160, in accordance with some embodiments. The dielectric layer 170 includes oxide (such as silicon oxide), in accordance with some embodiments. The dielectric layer 170 is formed by a chemical vapor deposition (CVD) process, in accordance with some embodiments.

Figure 1E:
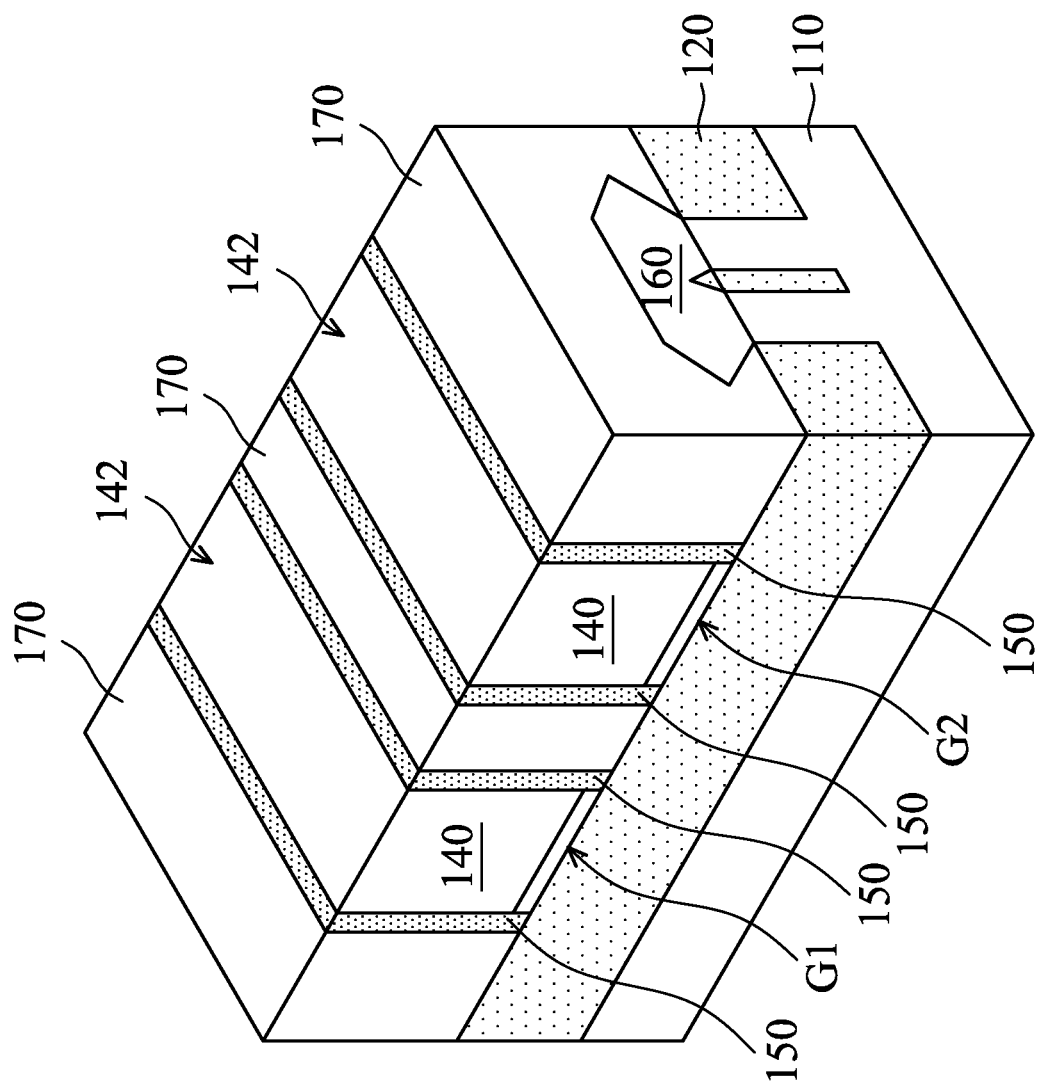

As shown in FIG. 1E, a planarization process is then performed on the dielectric layer 170 until top surfaces 142 of the gate electrodes 140 are exposed, in accordance with some embodiments. The planarization process includes a chemical mechanical polishing (CMP) process, in accordance with some embodiments.

Figure 1F:
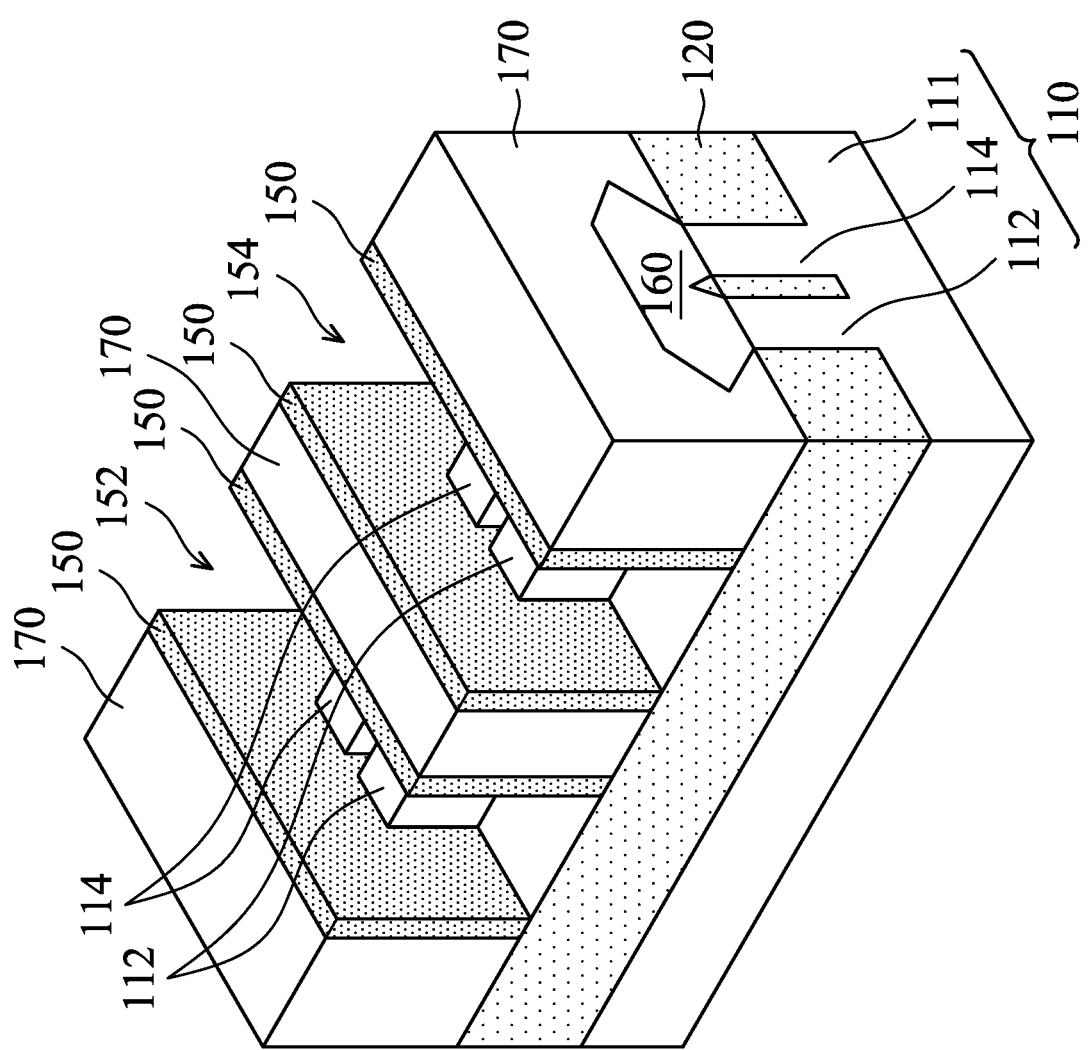

As shown in FIG. 1F, the gate structures G1 and G2 are removed, in accordance with some embodiments. The removal process includes a wet etching process, in accordance with some embodiments. After the removal process, trenches 152 and 154 are formed in the spacer layer 150, in accordance with some embodiments. The trench 152 exposes portions of the fin structures 112 and 114, in accordance with some embodiments. The trench 154 exposes portions of the fin structures 112 and 114, in accordance with some embodiments.

Figure 1G:
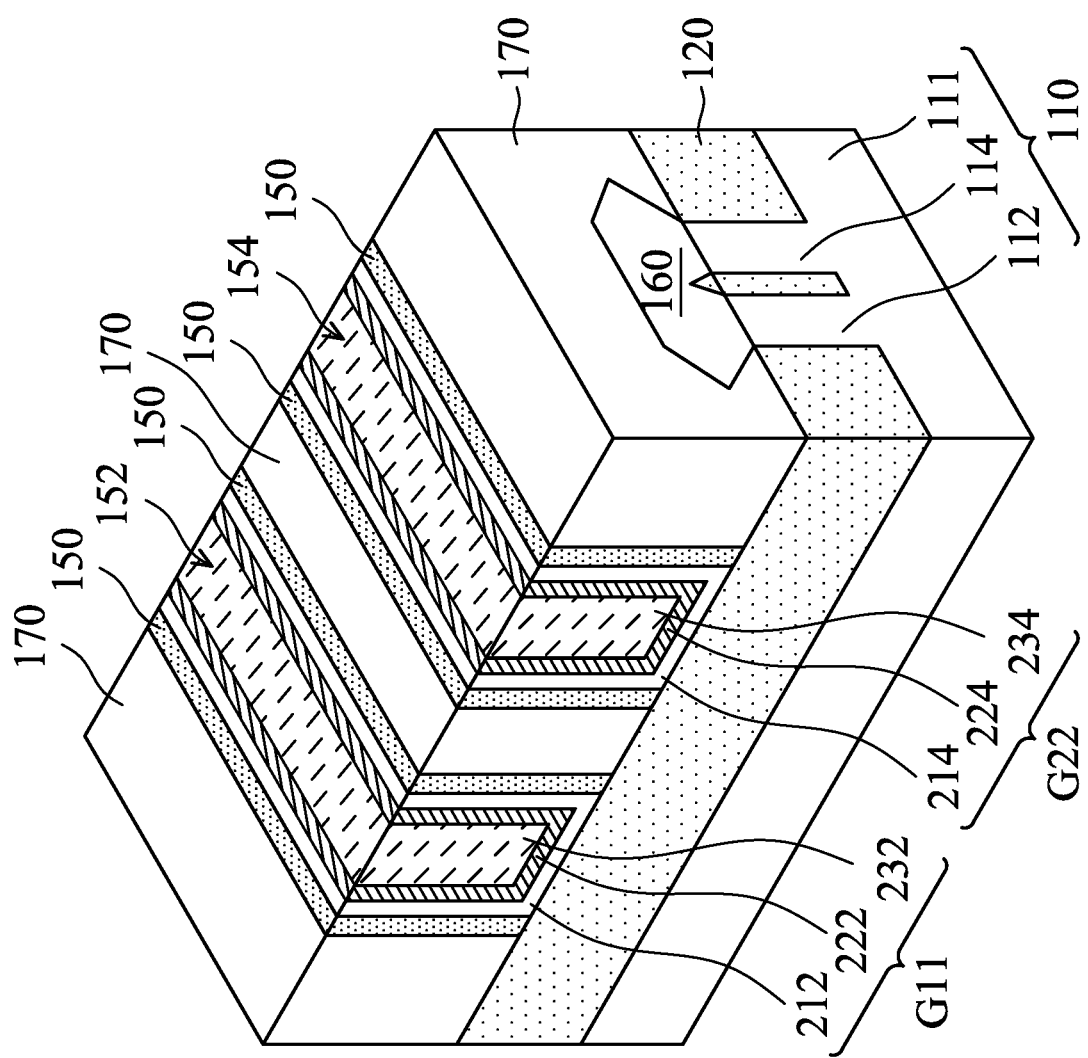

As shown in FIG. 1G, gate dielectric layers 212 and 214 are respectively formed in the trenches 152 and 154 to cover the fin structures 112 and 114 exposed by the trenches 152 and 154, in accordance with some embodiments. The gate dielectric layers 212 and 214 are made of silicon oxide, silicon nitride, silicon oxynitride, a dielectric material with high dielectric constant (high-K), another suitable dielectric material, or a combination thereof.

Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

Thereafter, as shown in FIG. 1G, work function metal layers 222 and 224 are respectively deposited over the gate dielectric layers 212 and 214, in accordance with some embodiments. The work function metal layers 222 and 224 provide a desired work function for transistors to enhance device performance including improved threshold voltage.

In the embodiments of forming an NMOS transistor, the work function metal layers 222 and/or 224 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

In the embodiments of forming a PMOS transistor, the work function metal layers 222 and/or 224 can be a p-type metal capable of providing a work function value suitable for the device, such as equal to or greater than about 4.8 eV. The p-type metal may be made of metal, metal carbide, metal nitride, other suitable materials, or a combination thereof.

For example, the p-type metal is made of titanium, titanium nitride, other suitable materials, or a combination thereof. The work function metal layers 222 and 224 are formed using a deposition process and a planarization process, in accordance with some embodiments. The deposition process includes a physical vapor deposition (PVD) process, a CVD process, an atomic layer deposition (ALD), a plating process, another suitable method, or a combination thereof.

In some embodiments, the work function metal layers 222 and 224 are made of different materials. The work function metal layers 222 and 224 are formed individually, in accordance with some embodiments. For example, during the formation of the work function metal layer 222, the trench 154 is covered by a first mask layer (not shown), and during the formation of the work function metal layer 224, the trench 152 is covered by a second mask layer (not shown).

In some other embodiments, the work function metal layers 222 and 224 are made of the same material. The work function metal layers 222 and 224 are formed in the same deposition process, in accordance with some embodiments.

Afterwards, as shown in FIG. 1G, gate electrode layers 232 and 234 (also called metal gate electrode layers) are respectively deposited over the work function metal layers 222 and 224 to fill the trenches 152 and 154, in accordance with some embodiments. The gate electrode layers 232 and 234 are made of a suitable metal material, such as aluminum, tungsten, gold, platinum, cobalt, another suitable metal, an alloy thereof, or a combination thereof, in accordance with some embodiments.

The gate electrode layer 232, the work function metal layer 222, and the gate dielectric layer 212 together form a gate structure G11, in accordance with some embodiments. The gate electrode layer 234, the work function metal layer 224, and the gate dielectric layer 214 together form a gate structure G22, in accordance with some embodiments.

Figure 1H:
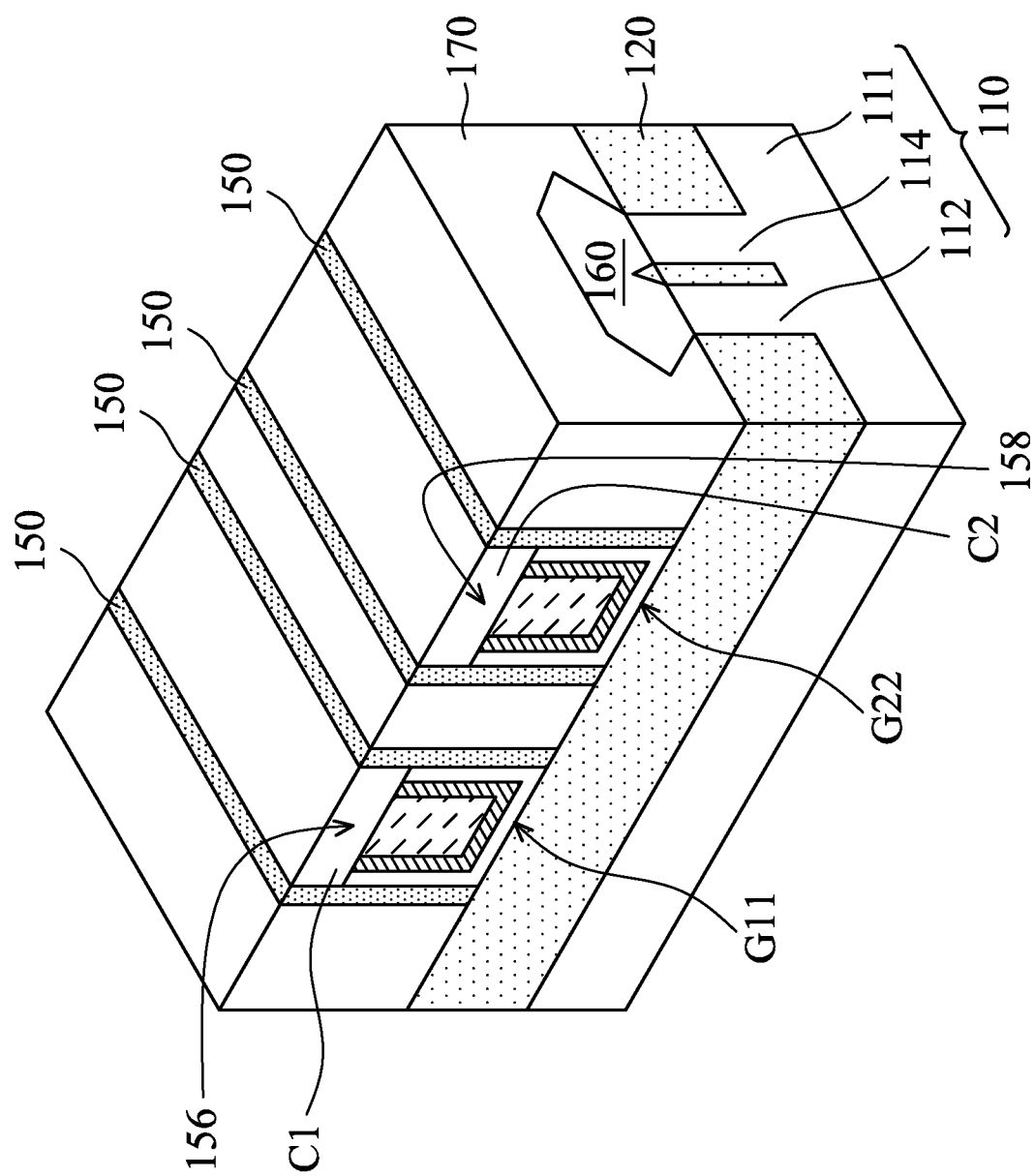

As shown in FIG. 1H, upper portions of the gate structures G11 and G22 are removed, in accordance with some embodiments. After the removal process, recesses 156 and 158 are formed in the spacer layer 150, in accordance with some embodiments. The removal process of the upper portions of the gate structures G11 and G22 includes a wet etching process or a dry etching process, in accordance with some embodiments.

As shown in FIG. 1H, cap layers C1 and C2 are respectively formed in the recesses 156 and 158, in accordance with some embodiments. The cap layers C1 and C2 are made of a dielectric material, such as silicon nitride, in accordance with some embodiments. The cap layers C1 and C2 are formed using a deposition process and a chemical mechanical polishing process, in accordance with some embodiments.

Figure 1I:
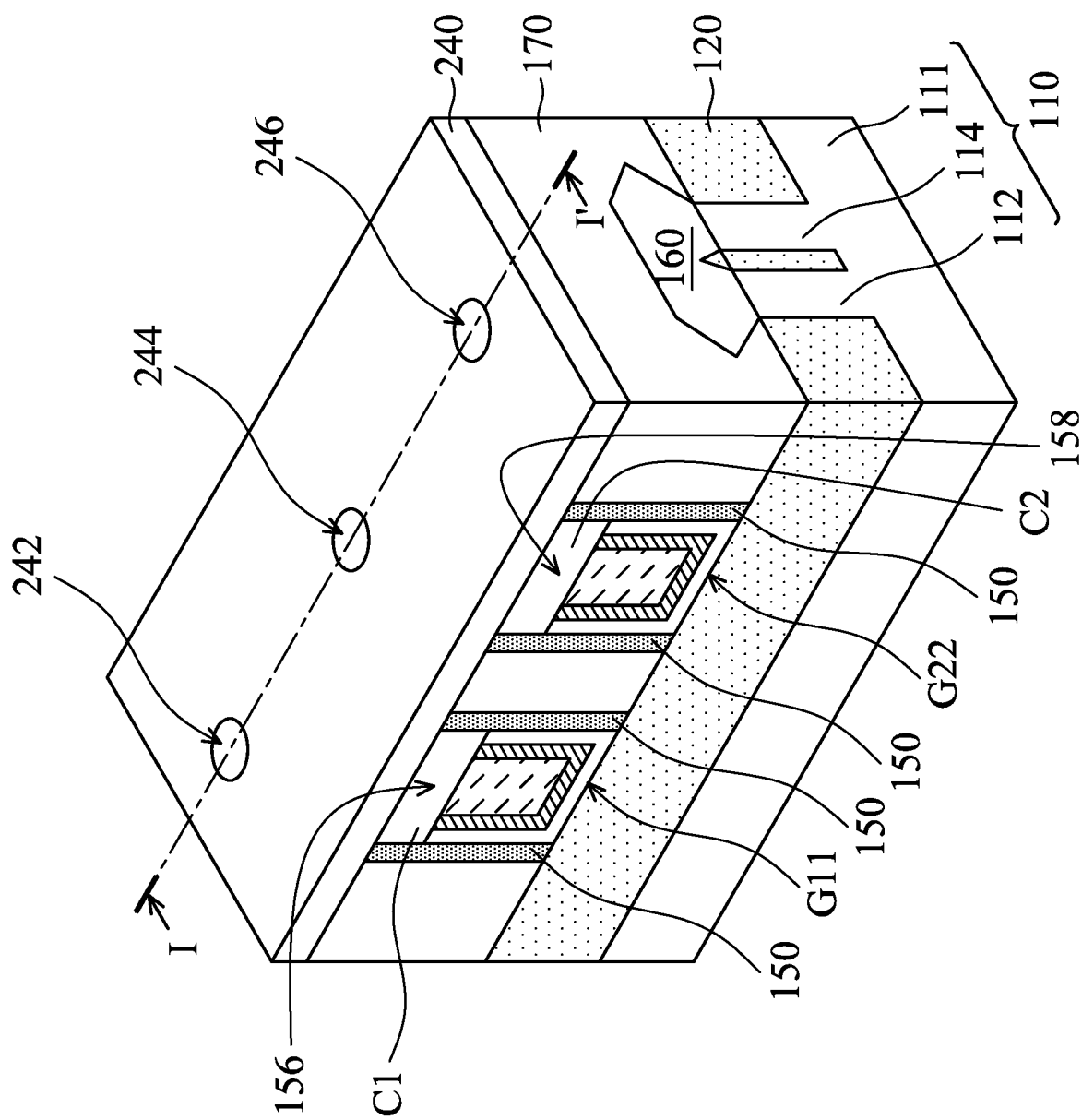
Figure 2A:
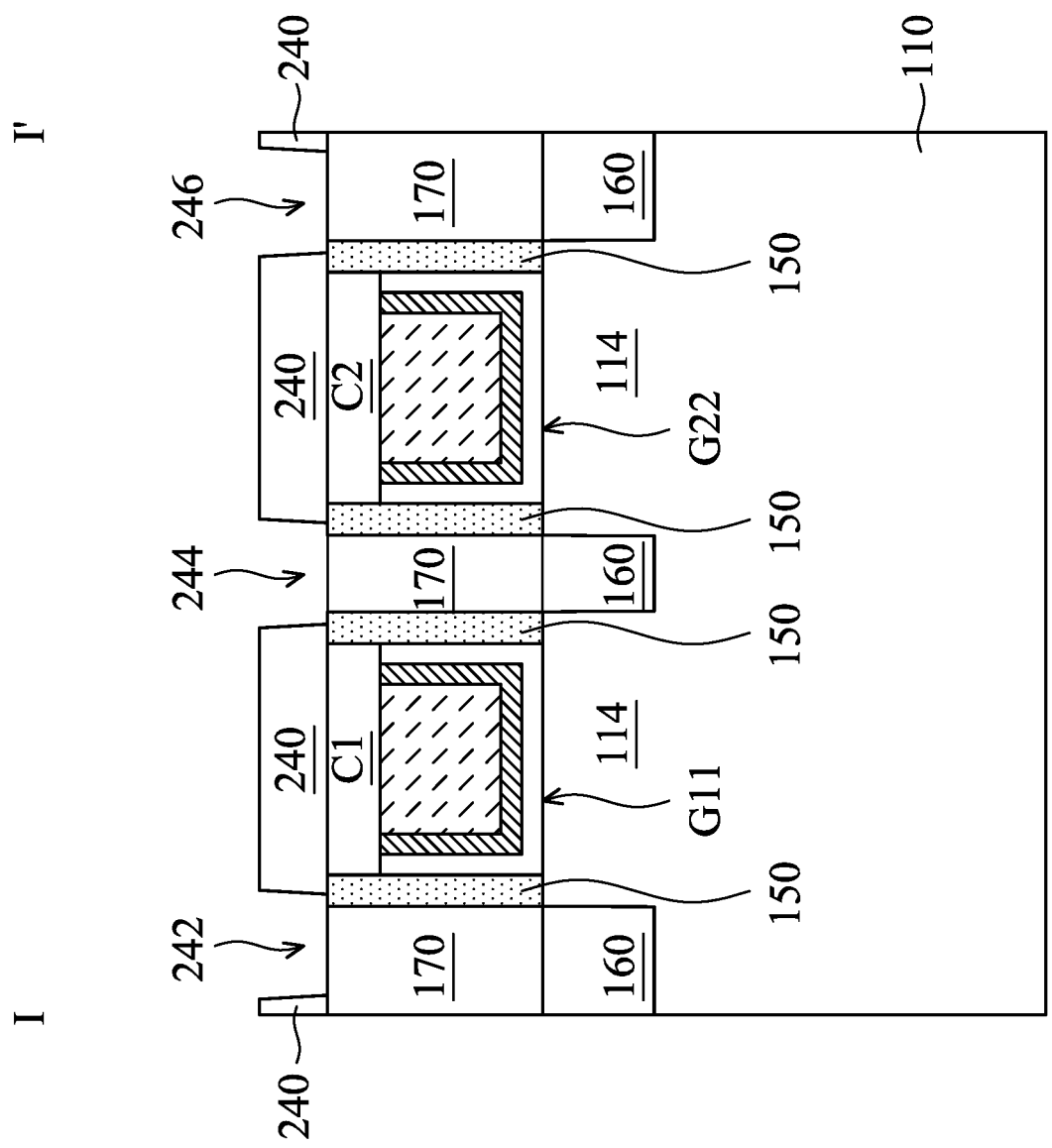
FIGS. 2A-2G are cross-sectional views of various stages of a process for forming a semiconductor device structure, in accordance with some embodiments.

FIG. 2A is a cross-sectional view illustrating the semiconductor device structure along a sectional line I-I' in FIG. 1I, in accordance with some embodiments. As shown in FIGS. 1I and 2A, a mask layer 240 is formed over the dielectric layer 170, the cap layers C1 and C2, and the spacer layer 150, in accordance with some embodiments.

As shown in FIGS. 1I and 2A, portions of the mask layer 240 are removed to form openings 242, 244, and 246 in the mask layer 240. The openings 242, 244, and 246 expose portions of the dielectric layer 170, in accordance with some embodiments. The portions of the mask layer 240 are removed using a photolithography process and an etching process, in accordance with some embodiments.

Figure 2B:
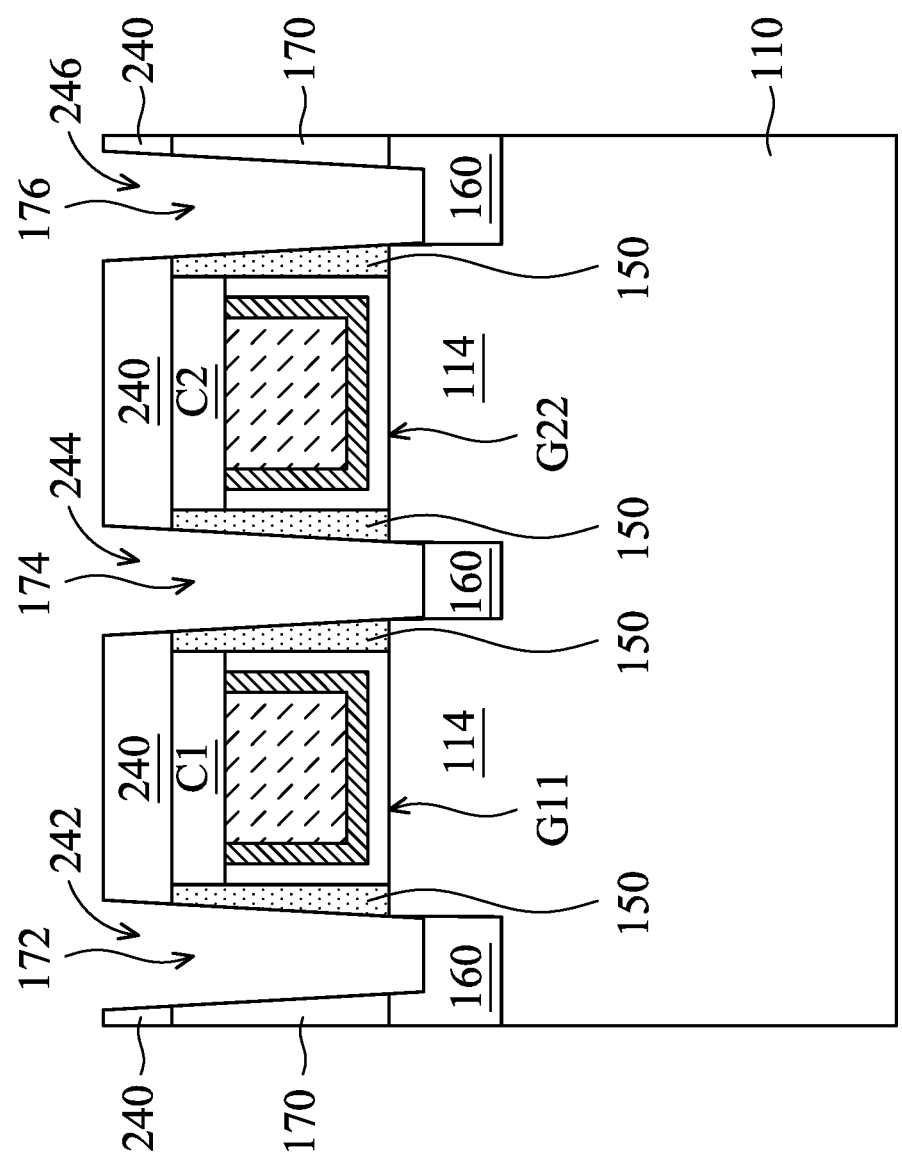

As shown in FIG. 2B, portions of the dielectric layer 170 (and portions of the spacer layer 150) are removed through the openings 242, 244, and 246 to form through holes 172, 174, and 176 in the dielectric layer 170, in accordance with some embodiments. The through holes 172, 174, and 176 pass through the dielectric layer 170 and penetrate into the stressors 160, in accordance with some embodiments. The through holes 172, 174, and 176 are formed using a dry etching process, in accordance with some embodiments.

Figure 2C:
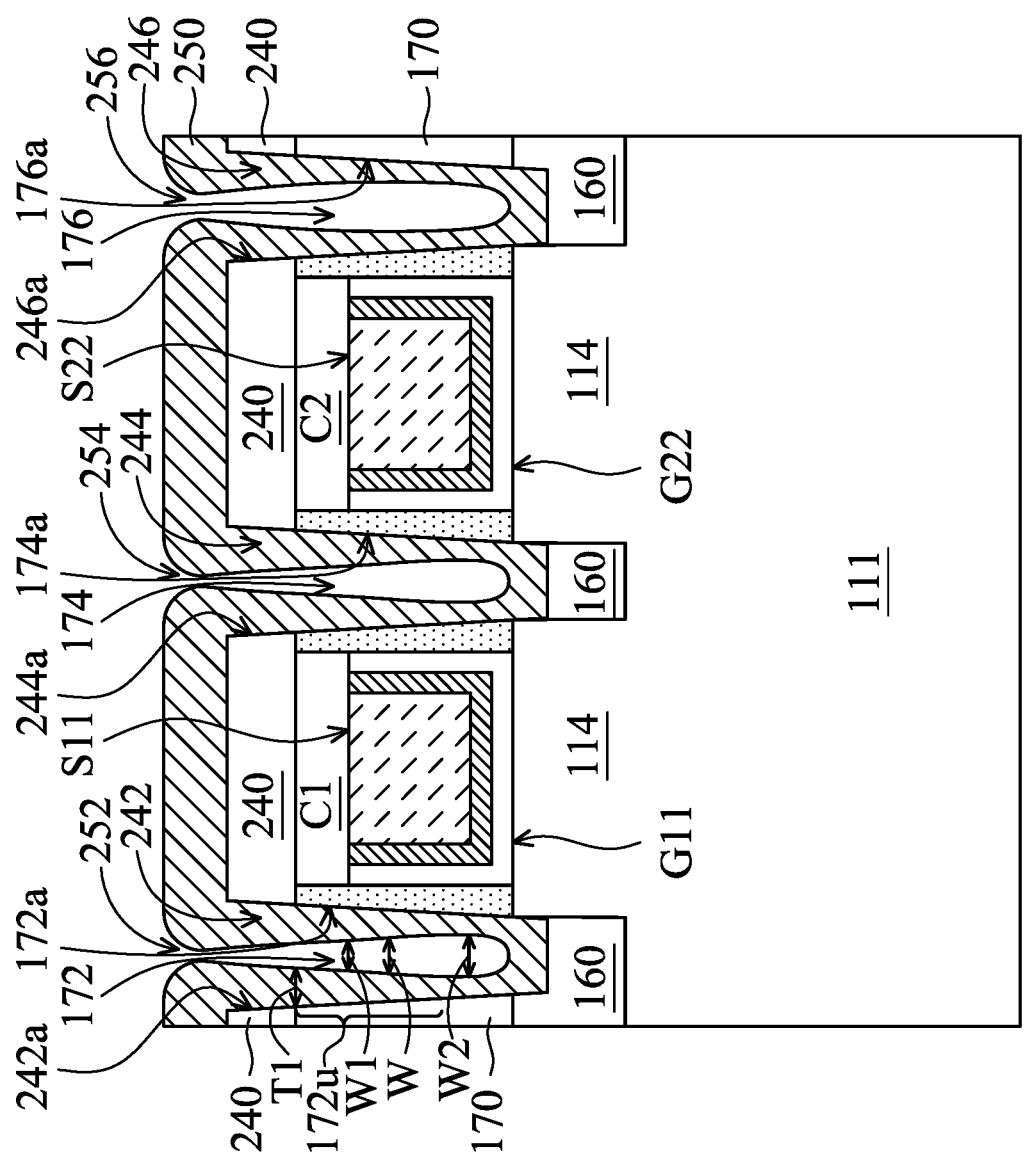

As shown in FIG. 2C, a metal layer 250 is deposited in the through holes 172, 174, and 176 to cover the stressors 160 exposed by the through holes 172, 174, and 176, in accordance with some embodiments. The metal layer 250 is formed over inner walls 172a, 174a, 176a, 242a, 244a, and 246a of the through holes 172, 174, and 176 and the openings 242, 244, and 246, in accordance with some embodiments. The metal layer 250 is further formed over the mask layer 240, in accordance with some embodiments. The entire metal layer 250 is a continuous layer, in accordance with some embodiments.

The metal layer 250 is made of titanium (Ti), nickel (Ni), cobalt (Co), another suitable metal material, or a combination thereof, in accordance with some embodiments. The metal layer 250 is deposited using an anisotropic deposition process, such as a physical vapor deposition (PVD) process, in accordance with some embodiments.

Therefore, a deposition rate of the metal layer 250 over the stressors 160 exposed by the through holes 172, 174, and 176 is greater than a deposition rate of the metal layer 250 over the inner walls 172a, 174a, 176a, 242a, 244a, and 246a of the through holes 172, 174, and 176 and the openings 242, 244, and 246, in accordance with some embodiments.

As a result, an average thickness of the metal layer 250 on the stressors 160 is greater than an average thickness of the metal layer 250 on the inner walls 172a, 174a, 176a, 242a, 244a, and 246a of the through holes 172, 174, and 176 and the openings 242, 244, and 246, in accordance with some embodiments.

Therefore, before the recess 252, 254, and 256 are closed by the metal layer 250 on the inner walls 172a, 174a, 176a, 242a, 244a, and 246a, the metal layer 250 on the stressors 160 obtains an enough thickness. As a result, the metal layer 250 on the stressors 160 is thick enough to be reacted with the stressors 160 so as to form metal semiconductor compound layers with enough thicknesses, and the metal semiconductor compound layers are between the metal layer 250 and the stressors 160, in accordance with some embodiments.

Similarly, a deposition rate of the metal layer 250 over the mask layer 240 (or the gate structures G11 and G22) is greater than the deposition rate of the metal layer 250 over the inner walls 172a, 174a, 176a, 242a, 244a, and 246a, in accordance with some embodiments.

The deposition rate of the metal layer 250 over the mask layer 240 (or the gate structures G11 and G22) is also greater than the deposition rate of the metal layer 250 over the stressors 160 exposed by the through holes 172, 174, and 176, in accordance with some embodiments.

Therefore, an average thickness of the metal layer 250 over the mask layer 240 (or the gate structures G11 and G22) is greater than the average thickness of the metal layer 250 on the stressors 160, in accordance with some embodiments. The average thickness of the metal layer 250 over the mask layer 240 (or the gate structures G11 and G22) ranges from about 3 nm to about 5 nm, in accordance with some embodiments.

In some embodiments, a thickness T1 of the metal layer 250 on an upper portion 172u of the inner wall 172a decreases toward the stressor 160. The metal layer 250 has recess 252, 254, and 256 in the through holes 172, 174, and 176 respectively, in accordance with some embodiments. In some embodiments, a width W1 of the recess 252 adjacent to a top surface S11 of the gate structure G11 is less than a width W2 of the recess 252 adjacent to the stressor 160. In some embodiments, a width W of the recess 252 continuously increases toward the stressor 160.

Figure 2D:
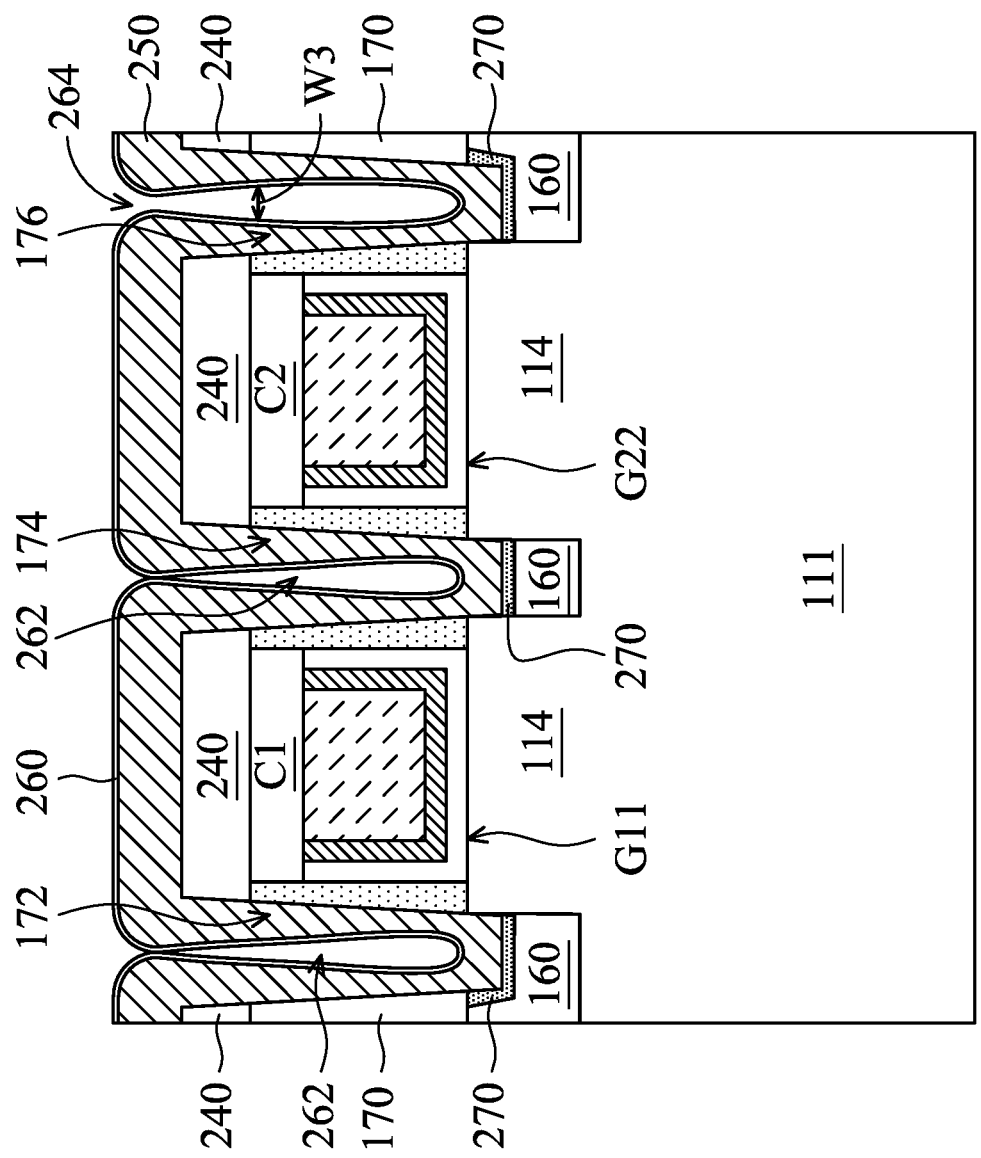

As shown in FIG. 2D, a metal nitride layer 260 is formed over the metal layer 250, in accordance with some embodiments. The metal nitride layer 260 is configured to prevent the metal layer 250 from being oxidized during a subsequent annealing process, in accordance with some embodiments.

The metal nitride layer 260 has closed voids 262 in the through holes 172 and 174, in accordance with some embodiments. The metal nitride layer 260 is made of titanium nitride or another suitable metal nitride material, in accordance with some embodiments.

The metal nitride layer 260 is formed using an isotropic deposition process, such as an atomic layer deposition (ALD) process, in accordance with some embodiments. In some embodiments, a deposition rate of the metal nitride layer 260 over the stressors 160 is substantially equal to a deposition rate of the metal nitride layer 260 over the inner walls 172a, 174a, and 176a of the through holes 172, 174, and 176.

The term "substantially equal to" means "within 10%", in accordance with some embodiments. For example, the term "substantially equal to" means the difference between the deposition rate of the metal nitride layer 260 over the stressors 160 and that over the inner walls 172a, 174a, and 176a is within 10% of the average deposition rate of the metal nitride layer 260, in accordance with some embodiments.

Therefore, an average thickness of the metal nitride layer 260 over the stressors 160 is substantially equal to an average thickness of the metal nitride layer 260 over the inner walls 172a, 174a, and 176a, in accordance with some embodiments. The average thickness of the metal nitride layer 260 ranges from about 0.5 nm to about 3 nm, in accordance with some embodiments. The metal nitride layer 260 has a recess 264, in accordance with some embodiments. In some embodiments, a width W3 of the recess 264 increases toward the stressor 160.

As shown in FIG. 2D, the metal layer 250 is reacted with the stressors 160 to form metal semiconductor compound layers 270 between the metal layer 250 and the stressors 160, in accordance with some embodiments. The metal semiconductor compound layers 270 are configured to reduce contact resistance between the stressors 160 and contact structures subsequently formed in the through holes 172, 174, and 176, in accordance with some embodiments.

The metal layer 250 and the stressors 160 are in direct contact with the metal semiconductor compound layers 270, in accordance with some embodiments. The metal semiconductor compound layers 270 are electrically connected to the stressors 160 thereunder, respectively, in accordance with some embodiments.

The metal semiconductor compound layers 270 are formed from the metal layer 250 and the stressors 160, in accordance with some embodiments. The metal semiconductor compound layers 270 are made of titanium silicide (TiSi$_2$), nickel silicide (NiSi), cobalt silicide (CoSi), or another suitable material with low resistance, in accordance with some embodiments. The metal layer 250 is reacted with the stressors 160 using an annealing process, in accordance with some embodiments. The process temperature of the annealing process ranges from about 500° C. to about 700° C., in accordance with some embodiments.

Figure 2E:
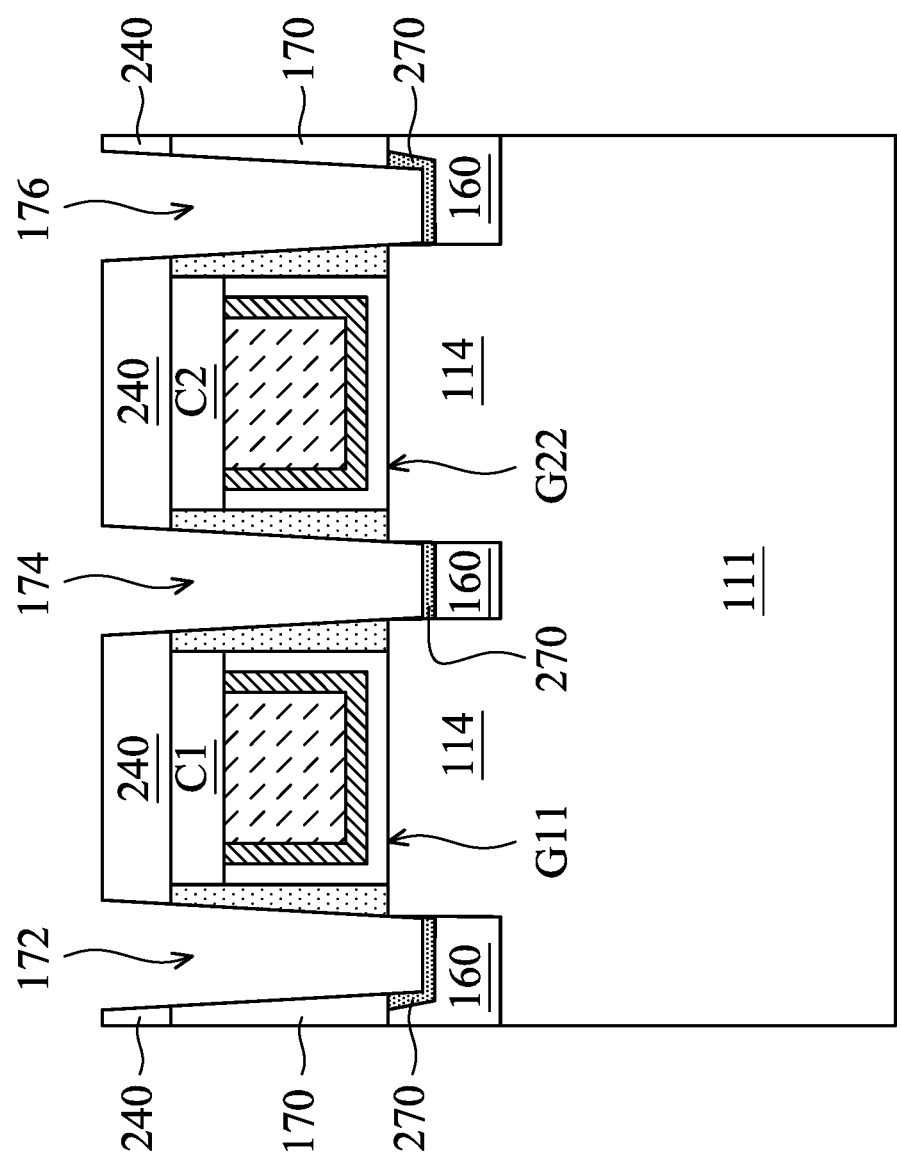

As shown in FIG. 2E, the unreacted metal layer 250 and the metal nitride layer 260 are removed, in accordance with some embodiments. The metal layer 250 and the metal nitride layer 260 are removed using an etching process, in accordance with some embodiments.

Figure 2F:
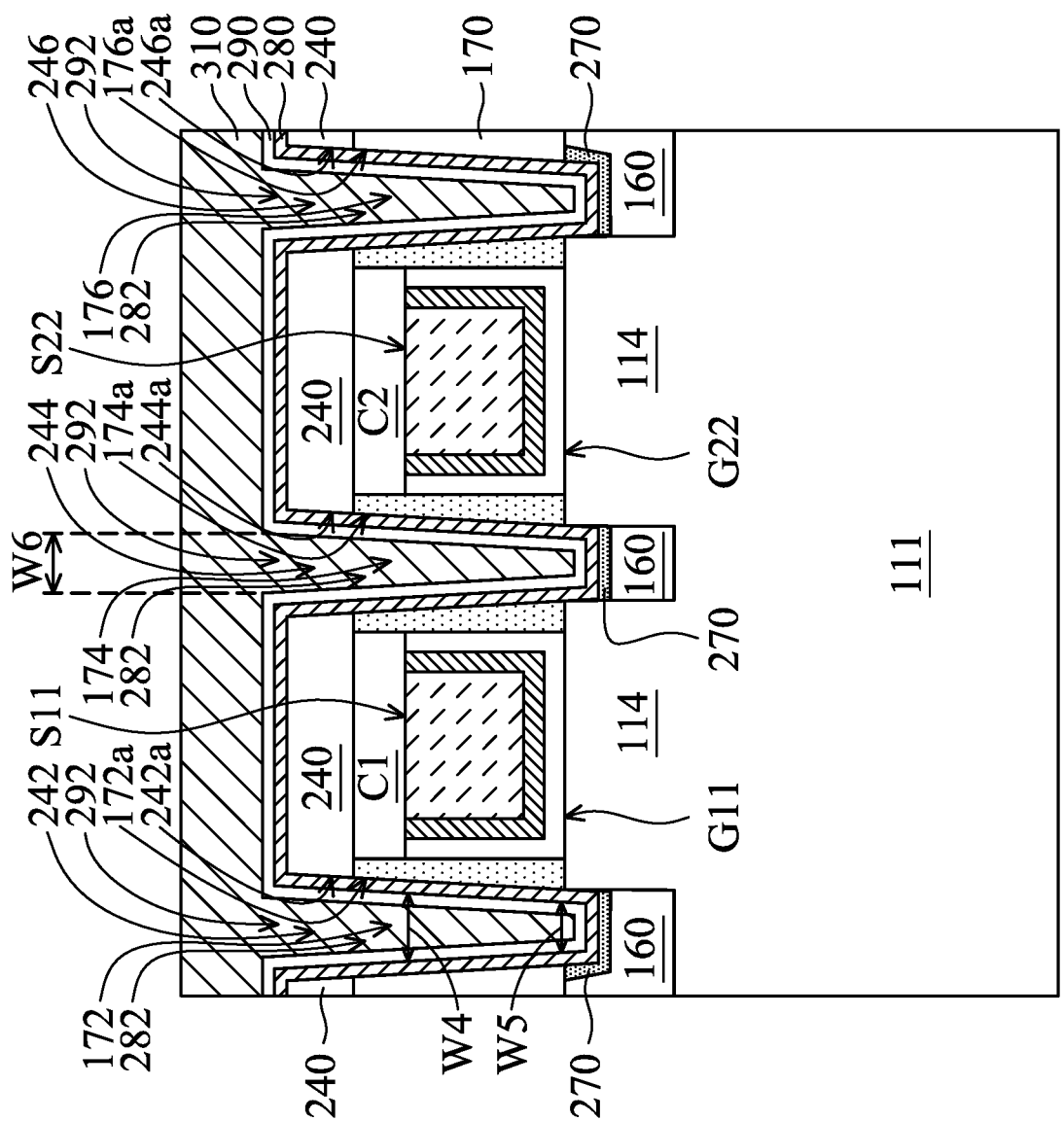

As shown in FIG. 2F, a metal layer 280 is deposited in the through holes 172, 174, and 176 to cover the metal semiconductor compound layers 270 exposed by the through holes 172, 174, and 176, in accordance with some embodiments. The metal layer 280 is in direct contact with the metal semiconductor compound layer 270, in accordance with some embodiments.

The metal layer 280 is formed over inner walls 172a, 174a, 176a, 242a, 244a, and 246a of the through holes 172, 174, and 176 and the openings 242, 244, and 246, in accordance with some embodiments. The metal layer 280 is further formed over the mask layer 240, in accordance with some embodiments.

The metal layer 280 is configured to improve the adhesion between the metal semiconductor compound layers 270 and a metal nitride layer formed on the metal layer 280 in the subsequent process, in accordance with some embodiments. The entire metal layer 280 is a continuous layer, in accordance with some embodiments. The metal layer 280 has recesses 282 in the through holes 172, 174, and 176 and the openings 242, 244, and 246, in accordance with some embodiments. In some embodiments, a width W4 of the recess 282 adjacent to the top surface S11 or S22 of the gate structure G11 or G22 is greater than or equal to a width W5 of the recess 282 adjacent to the stressor 160. In some embodiments, an average thickness of the metal layer 250 of FIG. 2C is greater than an average thickness of the metal layer 280. The average thickness of the metal layer 280 ranges from about 2 nm to about 3 nm, in accordance with some embodiments.

The metal layer 280 is made of titanium (Ti), nickel (Ni), cobalt (Co), another suitable metal material, or a combination thereof, in accordance with some embodiments. The metal layer 250 and the metal layer 280 are made of the same metal material, in accordance with some embodiments. The metal layer 280 is deposited using an isotropic deposition process, such as a chemical vapor deposition (CVD) process, in accordance with some embodiments.

Therefore, a deposition rate of the metal layer 280 over the stressors 160 exposed by the through holes 172, 174, and 176 is substantially equal to a deposition rate of the metal layer 280 over the inner walls 172a, 174a, 176a, 242a, 244a, and 246a of the through holes 172, 174, and 176 and the openings 242, 244, and 246, in accordance with some embodiments.

As a result, an average thickness of the metal layer 280 on the stressors 160 is substantially equal to an average thickness of the metal layer 280 on the inner walls 172a, 174a, 176a, 242a, 244a, and 246a of the through holes 172, 174, and 176 and the openings 242, 244, and 246, in accordance with some embodiments.

Therefore, the metal layer 280 conformally covers the inner walls 172a, 174a, 176a, 242a, 244a, and 246a and the metal semiconductor compound layers 270, in accordance with some embodiments. The using of the isotropic deposition process (e.g., a chemical vapor deposition process) prevents the recesses 282 from being closed by the metal layer 280 over the inner walls 172a, 174a, 176a, 242a, 244a, and 246a.

The term "substantially equal to" means "within 10%", in accordance with some embodiments. For example, the term "substantially equal to" means the difference between the deposition rate (or the average thickness) of the metal layer 280 on the stressors 160 and that on the inner walls 172a, 174a, and 176a is within 10% of the average deposition rate (or the average thickness) of the metal layer 280, in accordance with some embodiments.

Similarly, a deposition rate of the metal layer 280 over the mask layer 240 (or the gate structures G11 and G22) is substantially equal to the deposition rate of the metal layer 280 over the inner walls 172a, 174a, 176a, 242a, 244a, and 246a, in accordance with some embodiments.

The deposition rate of the metal layer 280 over the mask layer 240 (or the gate structures G11 and G22) is also substantially equal to the deposition rate of the metal layer 280 over the stressors 160 exposed by the through holes 172, 174, and 176, in accordance with some embodiments. Therefore, an average thickness of the metal layer 280 over the mask layer 240 (or the gate structures G11 and G22) is substantially equal to the average thickness of the metal layer 280 on the stressors 160, in accordance with some embodiments.

As shown in FIG. 2F, a metal nitride layer 290 is formed over the metal layer 280, in accordance with some embodiments. The metal nitride layer 290 is configured to prevent metal elements of a conductive layer subsequently formed over the metal nitride layer 290 from diffusing into the dielectric layer 170, in accordance with some embodiments. The metal nitride layer 290 has recesses 292 in the through holes 172, 174, and 176 and the openings 242, 244, and 246, in accordance with some embodiments.

The metal nitride layer 290 is made of titanium nitride or another suitable metal nitride material, in accordance with some embodiments. The metal nitride layer 290 and the metal layer 280 include a same metal element (e.g., Ti) to improve the adhesion between the metal nitride layer 290 and the metal layer 280, in accordance with some embodiments. The metal nitride layer 290 is formed using an isotropic deposition process, such as an atomic layer deposition (ALD) process, in accordance with some embodiments.

As shown in FIG. 2F, a conductive layer 310 is formed over the metal nitride layer 290 and is filled in the recesses 292, in accordance with some embodiments. The conductive layer 310 is made of tungsten (W), aluminum (Al), gold (Au), silver (Ag), a combination thereof, an alloy thereof, or another suitable conductive material. The conductive layer 310 is formed using a physical vapor deposition process, a chemical vapor deposition process, or another suitable process.

Since the metal layer 280 and the metal nitride layer 290 are formed using the isotropic deposition processes, each recess 292 has a wide enough opening for the conductive layer 310 to be filled in, in accordance with some embodiments. Each recess 292 has an opening width W6 ranging from about 8 nm to about 10 nm, in accordance with some embodiments.

Figure 2G:
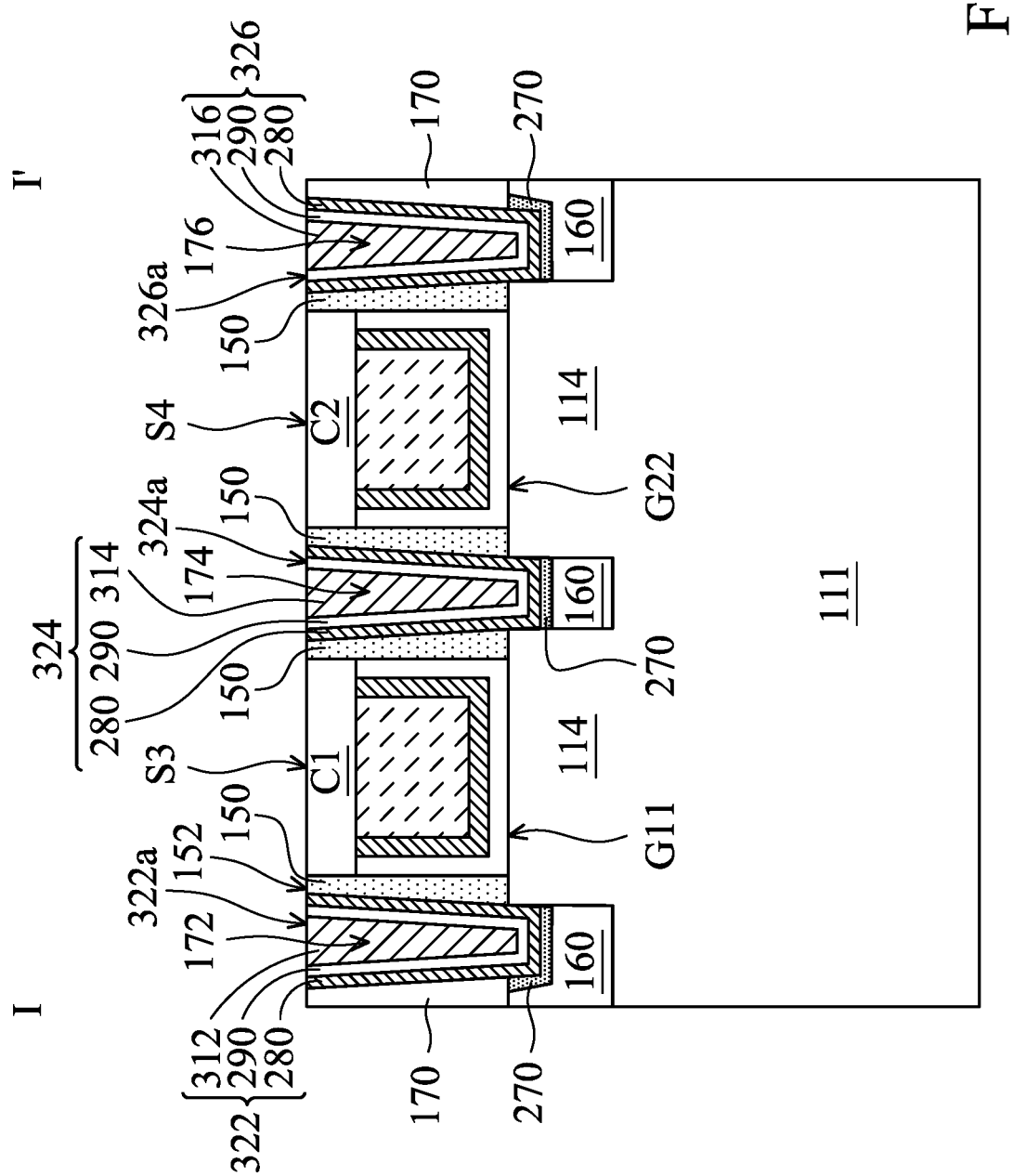
Figure 3:
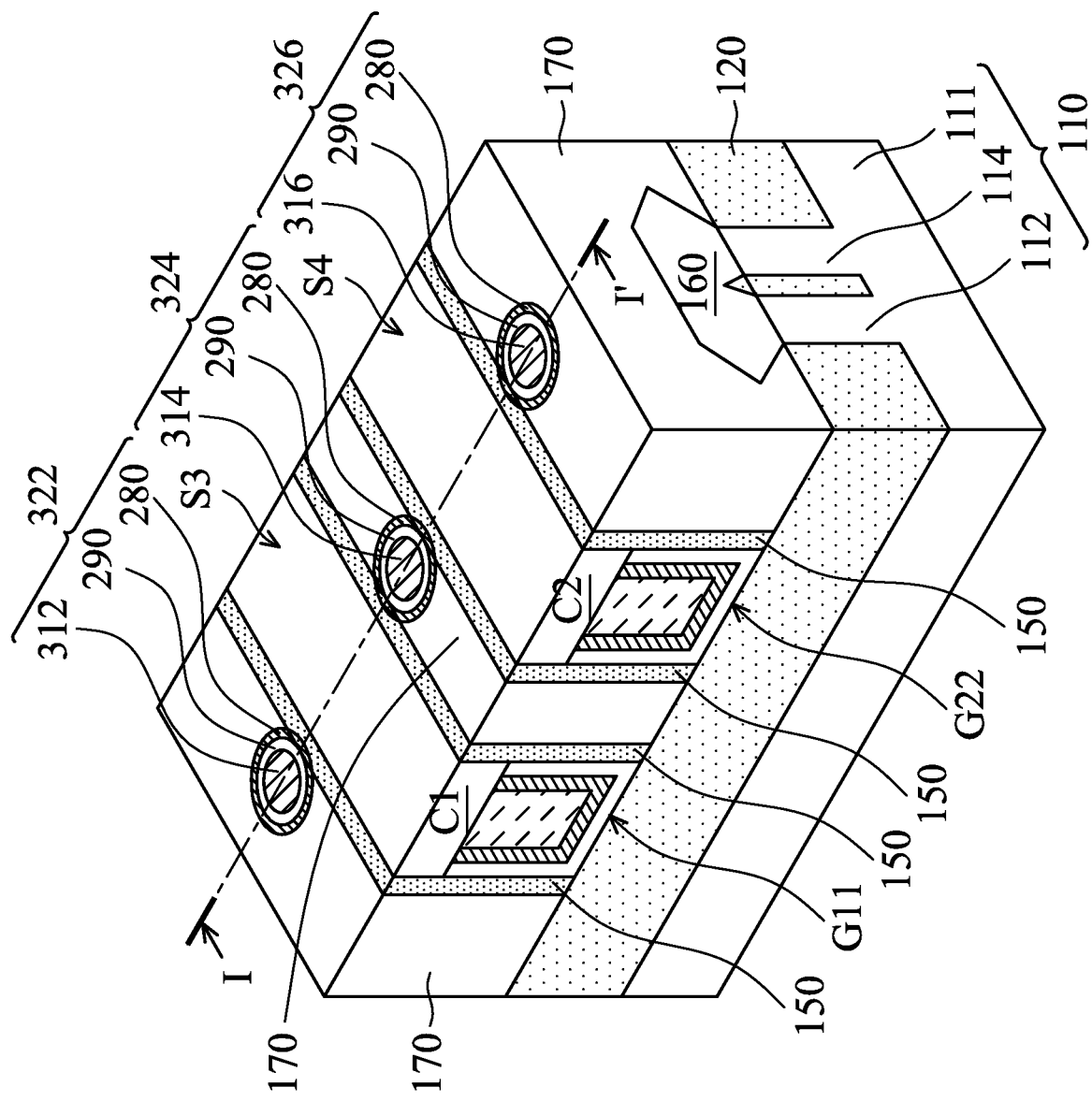
FIG. 3 is a perspective view of the semiconductor device structure of FIG. 2G, in accordance with some embodiments.

FIG. 3 is a perspective view of the semiconductor device structure of FIG. 2G, in accordance with some embodiments. FIG. 2G is a cross-sectional view illustrating the semiconductor device structure along a sectional line I-I' in FIG. 3, in accordance with some embodiments.

As shown in FIGS. 2G and 3, a chemical mechanical polishing process is performed until top surfaces S3 and S4 of the cap layers C1 and C2 are exposed, in accordance with some embodiments. The chemical mechanical polishing process removes the mask layer 240 and upper portions of the conductive layer 310, the metal nitride layer 290, and the metal layer 280, in accordance with some embodiments.

The conductive layer 310 remaining in the through hole 172 forms a conductive structure 312, in accordance with some embodiments. The metal nitride layer 290 is between and in direct contact with the conductive structure 312 and the metal layer 280, in accordance with some embodiments. The conductive structure 312 is separated from the metal layer 280 by the metal nitride layer 290 therebetween, in accordance with some embodiments.

The conductive layer 310 remaining in the through hole 174 forms a conductive structure 314, in accordance with some embodiments. The metal nitride layer 290 is between and in direct contact with the conductive structure 314 and the metal layer 280, in accordance with some embodiments. The conductive structure 314 is separated from the metal layer 280 by the metal nitride layer 290 therebetween, in accordance with some embodiments.

The conductive layer 310 remaining in the through hole 176 forms a conductive structure 316, in accordance with some embodiments. The metal nitride layer 290 is between and in direct contact with the conductive structure 316 and the metal layer 280, in accordance with some embodiments. The conductive structure 316 is separated from the metal layer 280 by the metal nitride layer 290 therebetween, in accordance with some embodiments.

The metal nitride layer 290 and the metal layer 280 remaining in the through hole 172 and the conductive structure 312 together form a contact plug 322, in accordance with some embodiments. The metal nitride layer 290 and the metal layer 280 remaining in the through hole 174 and the conductive structure 314 together form a contact plug 324, in accordance with some embodiments. The metal nitride layer 290 and the metal layer 280 remaining in the through hole 176 and the conductive structure 316 together form a contact plug 326, in accordance with some embodiments.

The contact plugs 322, 324, and 326 are electrically connected to the metal semiconductor compound layers 270 thereunder, respectively, in accordance with some embodiments. In some embodiments, top surfaces 322a, 324a, 326a, and 152 of the contact plugs 322, 324, 326, and the spacer layer 150 and the top surfaces S3 and S4 of the cap layers C1 and C2 are coplanar.

In accordance with some embodiments, semiconductor device structures and methods for forming the same are provided. The methods (for forming the semiconductor device structure) form a first metal layer on a stressor exposed by a through hole using a PVD process to increase a thickness of the first metal layer on the stressor so as to form a metal semiconductor compound layer with an enough thickness. The methods remove the first metal layer and form a second metal layer over the stressor exposed by the through hole using a CVD process to conformally cover the stressor and the sidewalls of the through hole.

In accordance with some embodiments, a method for forming a semiconductor device structure is provided. The method includes providing a semiconductor substrate, a gate structure, a first doped structure, a second doped structure, and a dielectric layer. The gate structure is over the semiconductor substrate and is between the first doped structure and the second doped structure, and the dielectric layer is over the semiconductor substrate to cover the first doped structure and the second doped structure. The method includes forming a through hole in the dielectric layer. The through hole exposes the first doped structure. The method includes performing a physical vapor deposition process to deposit a first metal layer over the first doped structure exposed by the through hole. The method includes reacting the first metal layer with the first doped structure to form a metal semiconductor compound layer between the first metal layer and the first doped structure. The method includes removing the first metal layer. The method includes performing a chemical vapor deposition process to deposit a second metal layer in the through hole. The method includes forming a conductive structure in the through hole and over the second metal layer.

In accordance with some embodiments, a method for forming a semiconductor device structure is provided. The method includes providing a semiconductor substrate, a gate structure, a first stressor, a second stressor, and a dielectric layer. The gate structure is over the semiconductor substrate and is between the first stressor and the second stressor, and the dielectric layer is over the semiconductor substrate to cover the first stressor and the second stressor. The method includes forming a through hole in the dielectric layer. The through hole exposes the first stressor. The method includes performing an anisotropic deposition process to deposit a first metal layer on the first stressor exposed by the through hole and an inner wall of the through hole. The method includes reacting the first metal layer with the first stressor to form a metal semiconductor compound layer between the first metal layer and the first stressor. The method includes removing the first metal layer. The method includes performing an isotropic deposition process to deposit a second metal layer on the first stressor exposed by the through hole and the inner wall of the through hole. The method includes forming a conductive structure in the through hole and over the second metal layer.

In accordance with some embodiments, a method for forming a semiconductor device structure is provided. The method includes providing a semiconductor substrate, a gate structure, a first stressor, a second stressor, and a dielectric layer. The gate structure is over the semiconductor substrate and is between the first stressor and the second stressor, and the dielectric layer is over the semiconductor substrate to cover the first stressor and the second stressor. The method includes forming a through hole in the dielectric layer. The through hole exposes the first stressor. The method includes forming a first metal layer in the through hole. The first metal layer has a first recess in the through hole, and a first width of the first recess adjacent to a top surface of the gate structure is less than a second width of the first recess adjacent to the first stressor. The method includes reacting the first metal layer with the first stressor to form a metal semiconductor compound layer between the first metal layer and the first stressor. The method includes removing the first metal layer. The method includes depositing a second metal layer in the through hole. The second metal layer has a second recess in the through hole, and a third width of the second recess adjacent to the top surface of the gate structure is greater than or equal to a fourth width of the second recess adjacent to the first stressor. The method includes forming a conductive structure in the through hole and over the second metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    providing a semiconductor substrate, a fin structure, a gate structure, a spacer layer, a first doped structure, a second doped structure, and a dielectric layer, wherein the gate structure is across the fin structure over the semiconductor substrate and is between the first doped structure and the second doped structure, the dielectric layer is over the semiconductor substrate to cover the first doped structure and the second doped structure, and the spacer layer is on a sidewall of the gate structure;
    forming a through hole in the dielectric layer, wherein the through hole exposes the first doped structure, the fin structure, and the spacer layer;
    performing a physical vapor deposition process to deposit a first metal layer over the first doped structure exposed by the through hole;
    reacting the first metal layer with the first doped structure to form a metal semiconductor compound layer between the first metal layer and the first doped structure;
    removing the first metal layer;
    performing a chemical vapor deposition process to deposit a second metal layer in the through hole, wherein the second metal layer is in direct contact with the fin structure; and
    forming a conductive structure in the through hole and over the second metal layer.

2. The method for forming the semiconductor device structure as claimed in claim 1, wherein a first deposition rate of the first metal layer over the first doped structure exposed by the through hole is greater than a second deposition rate of the first metal layer over an inner wall of the through hole.

3. The method for forming the semiconductor device structure as claimed in claim 2, wherein a third deposition rate of the second metal layer over the first doped structure exposed by the through hole is substantially equal to a fourth deposition rate of the second metal layer over the inner wall of the through hole.

4. The method for forming the semiconductor device structure as claimed in claim 1, further comprising:
    before the reacting of the first metal layer with the first doped structure, forming a metal nitride layer over the first metal layer; and
    after the reacting of the first metal layer with the first doped structure, removing the metal nitride layer.

5. The method for forming the semiconductor device structure as claimed in claim 4, wherein the metal nitride layer has a closed void in the through hole.

6. The method for forming the semiconductor device structure as claimed in claim 4, wherein the metal nitride layer is formed using a deposition process, and a first deposition rate of the metal nitride layer over the first doped structure is substantially equal to a second deposition rate of the metal nitride layer over an inner wall of the through hole.

7. The method for forming the semiconductor device structure as claimed in claim 1, wherein the first metal layer and the second metal layer are made of a same metal material.

8. The method for forming the semiconductor device structure as claimed in claim 1, further comprising:
    before the forming of the conductive structure, forming a metal nitride layer over the second metal layer, wherein the metal nitride layer is between the conductive structure and the second metal layer.

9. A method for forming a semiconductor device structure, comprising:
    providing a semiconductor substrate, a gate structure, a spacer layer, a first stressor, a second stressor, and a dielectric layer, wherein the gate structure is over the semiconductor substrate and is between the first stressor and the second stressor, the dielectric layer is over the semiconductor substrate to cover the first stressor and the second stressor, and the spacer layer is on a sidewall of the gate structure;

etching the dielectric layer and the spacer layer to form a through hole in the dielectric layer, wherein the through hole exposes the first stressor;

performing an anisotropic deposition process to deposit a first metal layer, wherein the first metal layer comprises a first portion on the first stressor exposed by the through hole and a second portion over a sidewall of the spacer layer, wherein an average thickness of the first portion is greater than an average thickness of the second portion;

reacting the first metal layer with the first stressor to form a metal semiconductor compound layer between the first metal layer and the first stressor;

removing the first metal layer;

performing an isotropic deposition process to deposit a second metal layer on the first stressor exposed by the through hole and the inner wall of the through hole, wherein a first side of the spacer layer is in direct contact with the gate structure, and a second side of the spacer layer is in direct contact with the second metal layer; and forming a conductive structure in the through hole and over the second metal layer.

10. The method for forming the semiconductor device structure as claimed in claim 9, wherein the first metal layer is further deposited over the gate structure, and a third average thickness of the first metal layer over the gate structure is greater than the average thickness of the first portion of the first metal layer.

11. The method for forming the semiconductor device structure as claimed in claim 9, wherein a thickness of the second portion of the first metal layer decreases toward the first stressor.

12. The method for forming the semiconductor device structure as claimed in claim 9, further comprising:
before the forming of the through hole, forming a mask layer over the gate structure and the dielectric layer, wherein the mask layer has an opening, the forming of the through hole comprises removing the dielectric layer through the opening, and the first metal layer is further deposited on the mask layer.

13. The method for forming the semiconductor device structure as claimed in claim 9, further comprising:
before the forming of the conductive structure, forming a metal nitride layer over the second metal layer, wherein the metal nitride layer is between the conductive structure and the second metal layer, and the metal nitride layer and the second metal layer comprise a same metal element.

14. A method for forming a semiconductor device structure, comprising:
providing a semiconductor substrate, a gate structure, a spacer layer, a first stressor, a second stressor, and a dielectric layer, wherein the gate structure is over the semiconductor substrate and is between the first stressor and the second stressor, the dielectric layer is over the semiconductor substrate to cover the first stressor and the second stressor, and the spacer layer is on a sidewall of the gate structure;

forming a through hole in the dielectric layer, wherein the through hole exposes the first stressor;

forming a first metal layer in the through hole, wherein the first metal layer is in direct contact with the spacer layer, the first metal layer has a first recess in the through hole, and a first width of the first recess level with a top surface of the gate structure is less than a second width of the first recess adjacent to the first stressor;

reacting the first metal layer with the first stressor to form a metal semiconductor compound layer between the first metal layer and the first stressor;

removing the first metal layer;

depositing a second metal layer in the through hole, wherein the second metal layer has a second recess in the through hole, and a third width of the second recess adjacent to the top surface of the gate structure is greater than or equal to a fourth width of the second recess adjacent to the first stressor; and forming a conductive structure in the through hole and over the second metal layer.

15. The method for forming the semiconductor device structure as claimed in claim 14, wherein a width of the first recess continuously increases toward the first stressor.

16. The method for forming the semiconductor device structure as claimed in claim 14, further comprising:
before the reacting of the first metal layer with the first stressor, forming a metal nitride layer over the first metal layer; and
after the reacting of the first metal layer with the first stressor, removing the metal nitride layer.

17. The method for forming the semiconductor device structure as claimed in claim 16, wherein the metal nitride layer has a third recess, and a width of the third recess increases toward the first stressor.

18. The method for forming the semiconductor device structure as claimed in claim 9, further comprising:
forming a fin structure over the semiconductor substrate, wherein the gate structure is formed across the fin structure and the first stressor and the second stressor are formed over the fin structure, and the metal semiconductor compound layer is in direct contact with the fin structure.

19. The method for forming the semiconductor device structure as claimed in claim 9, further comprising:
forming a fin structure over the semiconductor substrate, wherein the gate structure is formed across the fin structure and the first stressor and the second stressor are formed over the fin structure, and the second metal layer is in direct contact with the fin structure.

20. The method for forming the semiconductor device structure as claimed in claim 1, wherein a first side of the spacer layer is in direct contact with the gate structure, and a second side of the spacer layer is in direct contact with the second metal layer.

* * * * *